(12) United States Patent
Hsieh et al.

(10) Patent No.: US 10,211,242 B2
(45) Date of Patent: Feb. 19, 2019

(54) IMAGE SENSOR

(71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 15/445,933

(22) Filed: Feb. 28, 2017

(65) Prior Publication Data

US 2018/0247963 A1  Aug. 30, 2018

(51) Int. Cl.
*H01L 27/146* (2006.01)
*H04N 5/33* (2006.01)

(52) U.S. Cl.
CPC .. *H01L 27/14621* (2013.01); *H01L 27/14627* (2013.01); *H01L 27/14645* (2013.01); *H01L 27/14649* (2013.01); *H04N 5/332* (2013.01)

(58) Field of Classification Search
CPC ......... H01L 27/14621; H01L 27/14527; H01L 27/14645; H01L 27/14649; H01L 27/1465; H01L 31/02162; H04N 5/332
See application file for complete search history.

(56) References Cited

U.S. PATENT DOCUMENTS

| | | | |
|---|---|---|---|
| 9,425,227 B1* | 8/2016 | Wang | H01L 27/14621 |
| 2011/0085063 A1 | 4/2011 | Min et al. | |
| 2011/0235017 A1* | 9/2011 | Iwasaki | H04N 5/2354 356/4.01 |
| 2011/0260059 A1* | 10/2011 | Jiang | H01L 27/1461 250/330 |
| 2014/0138519 A1* | 5/2014 | Wang | G01S 17/89 250/206.1 |
| 2014/0333814 A1* | 11/2014 | Tashiro | H01L 27/14621 348/308 |
| 2015/0228689 A1* | 8/2015 | Lenchenkov | H01L 27/14649 257/432 |
| 2015/0311239 A1 | 10/2015 | Won et al. | |
| 2017/0237911 A1* | 8/2017 | Won | H04N 5/33 348/164 |
| 2017/0301720 A1* | 10/2017 | Tsai | H01L 27/14649 |

FOREIGN PATENT DOCUMENTS

| | | |
|---|---|---|
| CN | 104735427 A | 6/2015 |
| JP | 5645237 B2 | 12/2014 |
| TW | 201523860 A | 6/2015 |
| WO | 2010/084640 A1 | 7/2010 |

* cited by examiner

*Primary Examiner* — Wael Fahmy
*Assistant Examiner* — Sarah Salerno
(74) *Attorney, Agent, or Firm* — CKC & Partners Co., Ltd.

(57) ABSTRACT

An image sensor is provided. The image sensor includes a visible light receiving portion and an infrared receiving portion. The visible light receiving portion is configured to receive a visible light. The infrared receiving portion is configured to receive infrared. The visible light receiving portion comprises an infrared cutoff filter, plural primary color filters, and plural secondary color filters. The primary color filters and the secondary color filters are disposed on the infrared cutoff filter. The infrared receiving portion comprises plural first infrared pass filters and plural second infrared pass filters disposed on the first infrared pass filters. Each of the primary color filters occupies a first area. The secondary color filters and the second infrared pass filters occupy a second area substantially equal to the first area.

13 Claims, 2 Drawing Sheets

IMAGE SENSOR

BACKGROUND

Field of Invention

The present invention relates to an image sensor. More particularly, the present invention relates to an image sensor having infrared sensing function.

Description of Related Art

Filters are often employed in the image sensors of the camera to selectively transmit lights of certain wavelengths onto the light sensing layer. In conventional cameras, a Bayer filter is often formed on the light sensing layer. The Bayer filter is a color filter array that arranges one of the RGB color filters on each of the color pixels. The Bayer filter pattern includes 50% green filters, 25% red filters and 25% blue filters. Since each pixel generates a signal representing strength of a color component in the light and not the full range of colors, a demosaicing method is performed to interpolate a set of red, green and blue values for each pixel. However, the Bayer filter may increase noise of the infrared. Furthermore, an image sensor of the conventional camera does not have infrared sensing function.

SUMMARY

The present invention provides an image sensor. The image sensor includes a visible light receiving portion and an infrared receiving portion. The visible light receiving portion is configured to receive a visible light. The infrared receiving portion is configured to receive infrared. The visible light receiving portion comprises an infrared cutoff filter, plural primary color filters, and plural secondary color filters. The primary color filters and the secondary color filters are disposed on the infrared cutoff filter. The infrared receiving portion comprises plural first infrared pass filters and plural second infrared pass filters disposed on the first infrared pass filters. Each of the primary color filters occupies a first area. The secondary color filters and the second infrared pass filters occupy a second area substantially equal to the first area.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
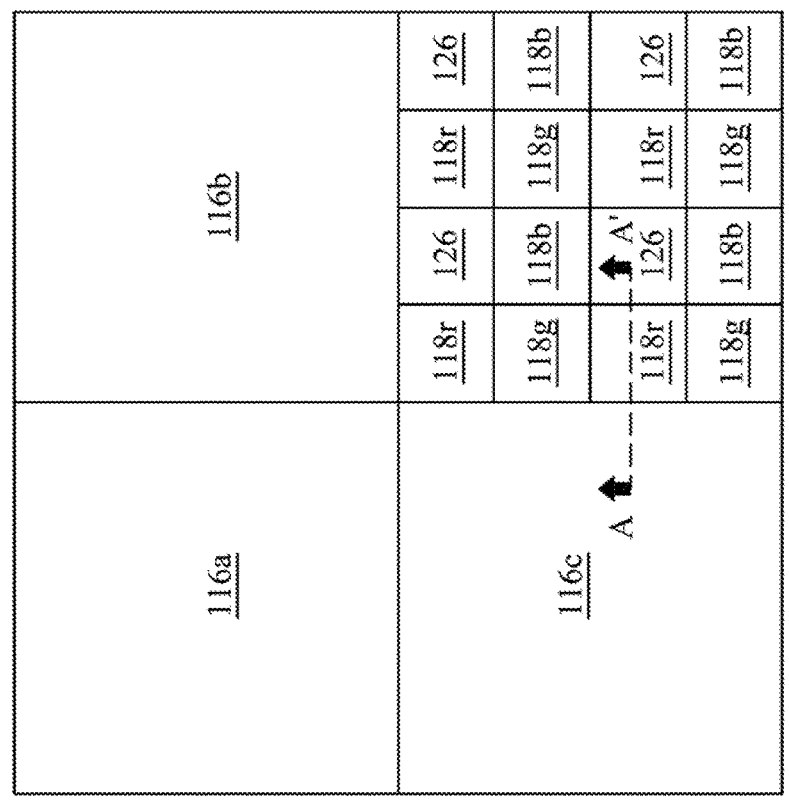
FIG. 1 is a top view of an image sensor according to an embodiment of the present invention.
Figure 2:
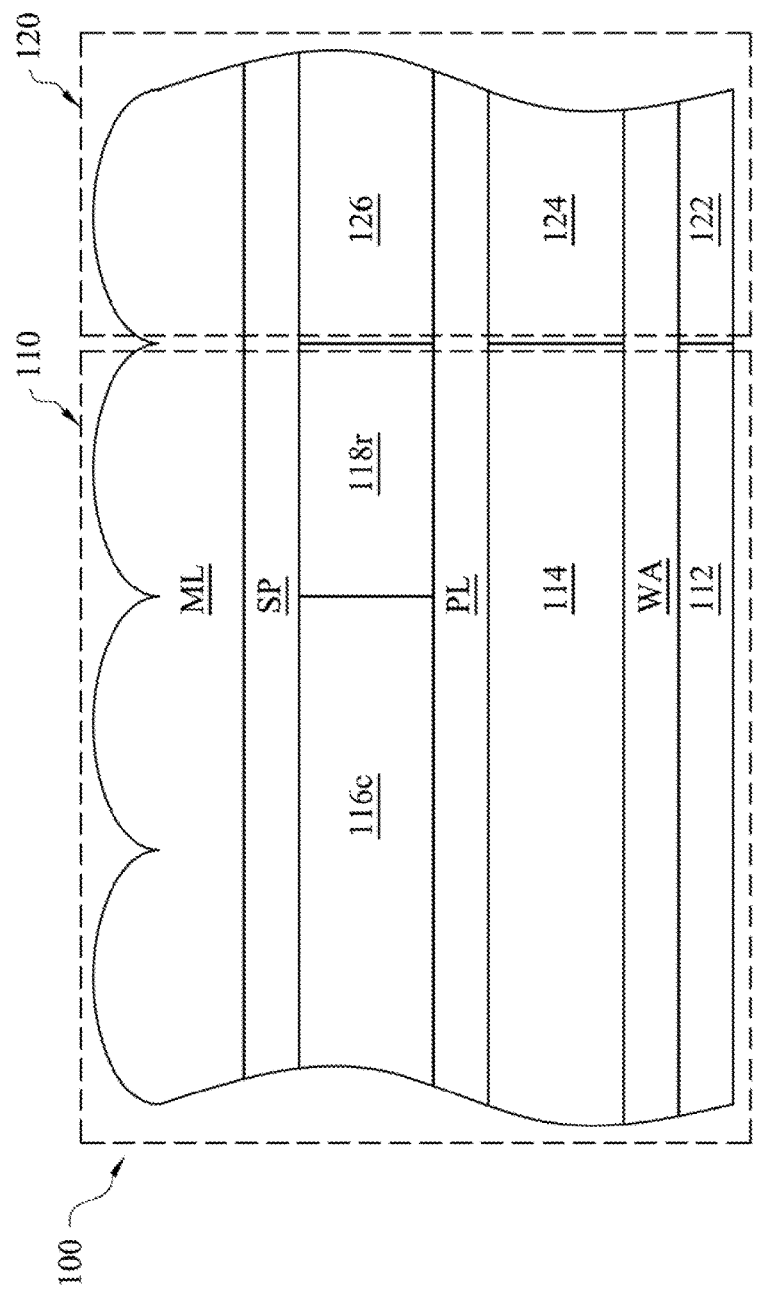
FIG. 2 is a cross-sectional view of a portion of the image sensor along a cut line in FIG. 1 according to the embodiment of the present invention.

FIG. 1 is a top view of an image sensor 100 according to an embodiment of the present invention, and FIG. 2 is a cross-sectional view of a portion of the image sensor 100 along a cut line A-A' in FIG. 1 according to the embodiment of the present invention. As shown in FIG. 2, the image sensor 100 includes a visible light receiving portion 110 and an infrared receiving portion 120. The visible light receiving portion 110 is configured to receive a visible light, and the infrared receiving portion 120 is configured to receive infrared.

As shown in FIGS. 1-2, the visible light receiving portion 110 includes a visible light sensing layer 112, an infrared cutoff filter 114, plural primary color filters 116a, 116b and 116c and plural secondary color filters 118r, 118g and 118b. The infrared cutoff filter 114, the primary color filters 116a, 116b and 116c and the secondary color filters 118r, 118g and 118b are disposed on the visible light sensing layer 112 to provide color light to the visible light sensing layer 112, and the visible light sensing layer 112 is configured to receive the visible light to generate main image signals accordingly. In this embodiment, the visible light sensing layer 112 includes at least one photodiode for sensing the color light, and the photodiode may be a complementary metal oxide semiconductor (CMOS) diode. However, embodiments of the present invention are not limited thereto.

The primary color filters 116a, 116b and 116c and the secondary color filters 118r, 118g and 118b are configured to provide the color light. The infrared cutoff filter 114 is configured to cutoff infrared. In other words, the infrared cutoff filter 114 can block the transmission of the infrared, while passing the color light. In this embodiment, the infrared cutoff filter 114 blocks lights having a wavelength greater than 850 nm, but embodiments of the present invention are not limited thereto. Further, in this embodiment, the primary color filters 116a, 116b and 116c and the secondary color filters 118r, 118g and 118b are located on the infrared cutoff filter 114, and the infrared cutoff filter 114 is located on the visible light sensing layer 112, but embodiments of the present invention are not limited thereto.

As shown in FIG. 2, the infrared receiving portion 120 includes an infrared sensing layer 122, plural first infrared pass filters 124 and plural second infrared pass filters 126. The first infrared pass filters 124 and the second infrared pass filters 126 are disposed on the infrared sensing layer 122 to provide the infrared to the infrared sensing layer 122, and the infrared sensing layer 122 is configured to receive the infrared to generate auxiliary image signals accordingly. In this embodiment, the infrared sensing layer 122 includes at least one photodiode for sensing the infrared, and the photodiode may be a CMOS diode. However, embodiments of the present invention are not limited thereto.

The first infrared pass filters 124 and the second infrared pass filters 126 are configured to cutoff the visible light. In other words, the first infrared pass filters 124 and the second infrared pass filters 126 can block the transmission of the visible light, while passing the light. In this embodiment, the first infrared pass filters 124 and the second infrared pass filters 126 block lights having a wavelength smaller than 850 nm, but embodiments of the present invention are not limited thereto. Further, in this embodiment, the first infrared pass filters 124 are disposed between the second infrared pass filters 126 and the infrared sensing layer 122, but embodiments of the present invention are not limited thereto.

As shown in FIG. 2, the visible light receiving portion 110 and the infrared receiving portion 120 further include a wafer WA, a planarization layer PL, a spacer layer SP and a micro-lens layer ML. The wafer WA is used to provide a substrate on which the infrared cutoff filter 114 and the first infrared pass filters 124 are formed. In this embodiment, the wafer WA is a glass wafer, but embodiments of the present invention are not limited thereto.

As shown in FIGS. 1-2, the planarization layer PL is formed on the infrared cutoff filter 114 and the first infrared pass filters 124 to provide a flat surface on which the primary color filters 116a, 116b and 116c, the secondary color filters 118r, 118g and 118b and the second infrared pass filters 126 are disposed. The planarization layer PL also provides a good interface to help the primary color filters 116a, 116b and 116c, the secondary color filters 118r, 118g and 118b and the infrared pass filters 126 to be attached on the planarization layer PL. It is noted that a thickness of the infrared cutoff filter 114 is substantially equal to that of the first infrared pass filters 124 in this embodiment.

The spacer layer SP is located on the primary color filters 116a, 116b and 116c, the secondary color filters 118r, 118g and 118b and the second infrared pass filters 126 to provide a flat surface on which the micro-lens layer ML is disposed. It is noted that a thickness of the primary color filters 116a, 116b and 116c, a thickness of the secondary color filters 118r, 118g and 118b and a thickness of the second infrared pass filters 126 are substantially equal in this embodiment. The micro-lens layer ML is configured to collect the infrared and the visible light. Specifically, when the image sensor 100 is used to sense an object, the object is focused though the micro-lens layer ML. Further, focus of the image sensor 100 can be adjusted by varying a thickness of the micro-lens layer ML.

It is noted that the material of the micro-lens layer ML may be epoxy, optical cement, polymethylmethacrylates (PMMAs), polyurethanes (PUs), polydimethylsiloxane (PDMS), or other thermal curing or photo-curing transparent materials, but the present invention is not limited thereto.

In this embodiment, the primary color filters 116a, 116b and 116c include a red color filter unit, a blue color filter unit and a green color filter unit, respectively, but embodiments of the present invention are not limited thereto. In this embodiment, each of the secondary color filters 118r, 118b and 118g includes a red pixel, a blue pixel, and a green pixel. As shown in FIG. 2, each of the primary color filters 116a, 116b and 116c, such as the primary color filter 116a, the primary color filter 116b or the primary color filter 116c, occupies a first area. The secondary color filters 118r, 118g and 118b and the second infrared pass filters 126 occupy a second area. As shown in FIG. 1, the first area is substantially equal to the second area.

In comparison with the conventional image sensor using the Bayer filter, the image sensor 100 of the present invention has infrared sensing function since the first infrared pass filters 124 and the second infrared pass filters 126 are disposed in the infrared receiving portion 120. Furthermore, the visible light received by the image sensor 100 of the present invention has smaller noise since the infrared cutoff filter 114 is disposed in the visible light receiving portion 110.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising:
   a visible light receiving portion configured to receive a visible light, wherein the visible light receiving portion comprises:
   an infrared cutoff filter;
   a plurality of primary color filters; and
   a plurality of secondary color filters, wherein the primary color filters and the secondary color filters are disposed on the infrared cutoff filter; and
   an infrared receiving portion configured to receive infrared, wherein the infrared receiving portion comprises:
   a plurality of first infrared pass filters;
   a plurality of second infrared pass filters disposed on the first infrared pass filters; and
   a planarization layer configured to provide a flat surface on which the primary color filters, the secondary color filters and the second infrared pass filters are disposed, wherein the visible light passes through the planarization layer after passing through the primary color filters and the secondary color filters, wherein the infrared passes through the planarization layer after passing through the second infrared pass filters;
   wherein each of the primary color filters occupies a first area, and the secondary color filters and the second infrared pass filters occupy a second area equal to the first area.

2. The image sensor of claim 1, wherein the visible light receiving portion further comprises a visible light photodiode, and the infrared cutoff filter is disposed on the visible light photodiode, wherein the visible light is received by the visible light photodiode after passing through the primary color filters, the secondary color filters and the infrared cutoff filter.

3. The image sensor of claim 2, wherein the infrared receiving portion further comprises an infrared photodiode, and the first infrared pass filters are disposed on the infrared photodiode, wherein the infrared is received by the infrared photodiode after passing through the second infrared pass filters and the first infrared pass filters.

4. The image sensor of claim 3, further comprising a wafer located on the visible light photodiode and the infrared photodiode, wherein a first portion of the wafer is located in the visible light receiving portion and a second portion of the wafer is located in the infrared receiving portion.

5. The image sensor of claim 4, wherein the first portion of the wafer is located between the infrared cutoff filter and the visible light photodiode, and the second portion of the wafer is located between the first infrared pass filters and the infrared photodiode.

6. The image sensor of claim 1, wherein the primary color filters comprise a red color filter unit, a green color filter unit, and a blue color filter unit.

7. The image sensor of claim 1, wherein each of the secondary color filters comprises a red pixel, a green pixel, and a blue pixel.

8. The image sensor of claim 1, wherein the planarization layer is located in the visible light receiving portion and the infrared receiving portion.

9. The image sensor of claim 1, further comprising a micro-lens layer configured to collect the infrared and the visible light.

10. The image sensor of claim 9, wherein the micro-lens layer is located on the top of the image sensor.

11. The image sensor of claim 9, wherein the micro-lens layer is located in the visible light receiving portion and the infrared receiving portion.

12. The image sensor of claim 9, further comprising a spacer layer configured to provide a flat surface on which the micro-lens layer is disposed.

13. The image sensor of claim 12, wherein the spacer layer is located in the visible light receiving portion and the infrared receiving portion.

* * * * *